United States Patent [19]
Shibuya et al.

[11] Patent Number: 5,576,518
[45] Date of Patent: Nov. 19, 1996

[54] VIA-STRUCTURE OF A MULTILAYER INTERCONNECTION CERAMIC SUBSTRATE

[75] Inventors: Akinobu Shibuya; Mitsuru Kimura, both of Tokyo, Japan

[73] Assignee: NEC Corporation, Tokyo, Japan

[21] Appl. No.: 439,945

[22] Filed: May 12, 1995

[30] Foreign Application Priority Data

May 13, 1994 [JP] Japan ................................. 6-099817

[51] Int. Cl.⁶ ................................................ H05K 1/02
[52] U.S. Cl. .......................... 174/264; 174/265; 174/262
[58] Field of Search ............................. 174/262, 263, 174/264, 265, 266

[56] References Cited

U.S. PATENT DOCUMENTS 3,873,756  3/1975  Gall et al. .......................... 174/68.5
4,318,954  3/1982  Jensen .................................. 428/209
4,715,117 12/1987  Enomoto .............................. 29/851
4,740,414  4/1988  Shaheen .............................. 428/210

FOREIGN PATENT DOCUMENTS 2234456  9/1990  Japan .
 391992  4/1991  Japan .
3145796  6/1991  Japan .

Primary Examiner—Laura Thomas
Attorney, Agent, or Firm—Whitham, Curtis, Whithman & McGinn

[57] ABSTRACT

A via-structure off a multilayer interconnection ceramic substrate for a multi-chip module, a semiconductor package and an insulating substrate has a high strength and a high reliability being produced at a low cost. A gap is provided at an interface between a via-conductor and ceramics, and filled with a resin. The resin is preferably of a thermosetting polyimide resin or a benzo-cyclo-butene resin.

20 Claims, 2 Drawing Sheets

VIA-STRUCTURE OF A MULTILAYER INTERCONNECTION CERAMIC SUBSTRATE

BACKGROUND OF THE INVENTION

1. Field of the Invention

The present invention relates to a via-structure of a multilayer interconnection ceramic substrate and, more particularly, to an enforced via-structure of a low cost ceramic substrate for mounting LSI chips and packagings.

2. Description of Prior Art

Multilayer interconnection ceramic substrates including, for examples, an insulating substrate, multilayer printed circuit board and ceramic packages for mounting LSIs are greatly used in the semiconductor industry.

FIGS. 1 and 2 are partial cross-sectional views each for showing a problem in a conventional multilayer interconnection ceramic substrate having a via-conductor formed in the vicinity of the substrate surface. In general, a via-conductor of a multilayer interconnection ceramic substrate, which interconnects terminals or bonding posts for inner leads, outer leads, semiconductor chips and packagings, is composed of a metal or an alloy such as W, Mo, Au, Ag, Cu or Ag-Pd. Since a metal has a thermal expansion coefficient higher than that of ceramic, cracks 4 shown in FIG. 1 frequently appear during steps for sintering and for post-treatment. Although an adhesive force of the ceramics to the via-conductor may be reduced in order to eliminate the cracks 4 in FIG. 1 by controlling a composition in a paste or an atmosphere for sintering, a peeling-off shown in FIG. 2 arises instead due to the low adhesive force. Hence, conventional multilayer interconnection ceramic substrates suffer problems of low mechanical strength and low reliability in electric performance.

Recently, a multilayer interconnection substrate composed of a ceramic substrate has been reported, which has a polyimide layer for interconnection layers and is formed on the ceramic substrate. The ceramic substrate, however, will have cracks in the vicinity of the substrate surface as shown in FIG. 3. In view of the problem of the cracks, another ceramic substrate is proposed, which has thereon a photo-sensitive resin film for covering cracks and having holes only for through-holes, by Patent Publication No. JP-A-90-234456. However, a photo-sensitive resin film has a problem that a manufacturing cost for a semiconductor devices increases and an additional problem that cracks and peelings-off formed in the ceramic substrate involve failures such as swelling of the resin.

Meanwhile, it is proposed by Patent Publication No. JP-A- 91-145796 that, in a printed circuit board having a through-hole filled with a conductive paste, treatment of a sidewall surface of the through-hole with a silane coupling agent strengthens an affinity between a conductive paste and an insulator layer formed by impregnating a resin into a base material having a sheet form. However, such a treatment cannot eliminate any cracks when it is applied to a sintered metallic conductor and a ceramic insulator.

As a countermeasure to a metallic ion migration, a method for manufacturing a printed circuit board is proposed by Patent Publication No. JP-A-91-91992, wherein a through-hole is filled with an insulating resin and a conductive paste. This technology, however, cannot be applied if the substrate is of ceramics or if the conductor is of a sintered metal.

As described above, it is difficult to obtain a structure having a high strength and a high electric reliability at a low cost in a multilayer interconnection ceramic substrate having a via-hole.

SUMMARY OF THE INVENTION

In view of the foregoing, it is an object of the present invention to provide a multilayer interconnection ceramic substrate having a high strength and a high electric reliability manufactured at a low cost. According to the present invention, there is provided a multilayer interconnection substrate comprising a ceramic substrate, a via-conductor penetrating the ceramic substrate, and a resin layer formed at an interface between the via-conductor and the ceramic substrate and at least in the vicinity of the surface of the ceramic substrate.

BRIEF DESCRIPTION OF THE DRAWINGS

The above and further objects as well as features and advantages of the present invention will be more apparent from the following description, taken in conjunction with the accompanying drawings in which.

DETAILED DESCRIPTION OF PREFERRED EMBODIMENTS

Figure 1:
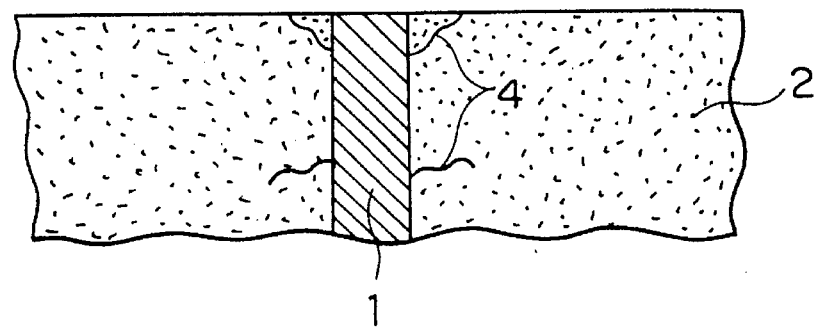
FIG. 1 is a cross-sectional view showing a conventional multilayer interconnection ceramic substrate having cracks in the vicinity of a via-conductor.
Figure 2:
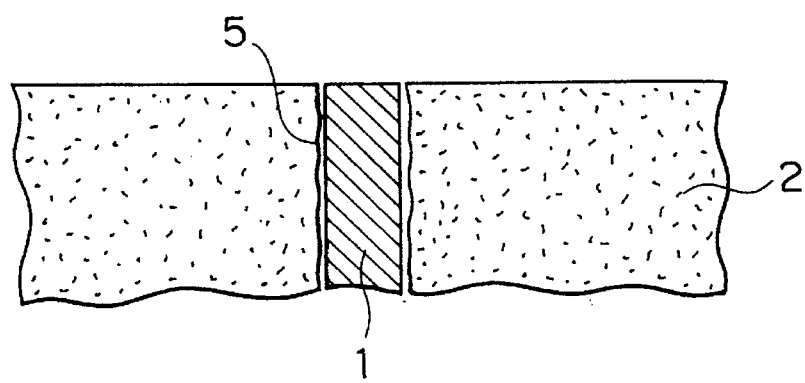
FIG. 2 is a cross-sectional view showing a conventional multilayer interconnection ceramic substrate having a peeling-off in the vicinity of a via-conductor.
Figure 3:
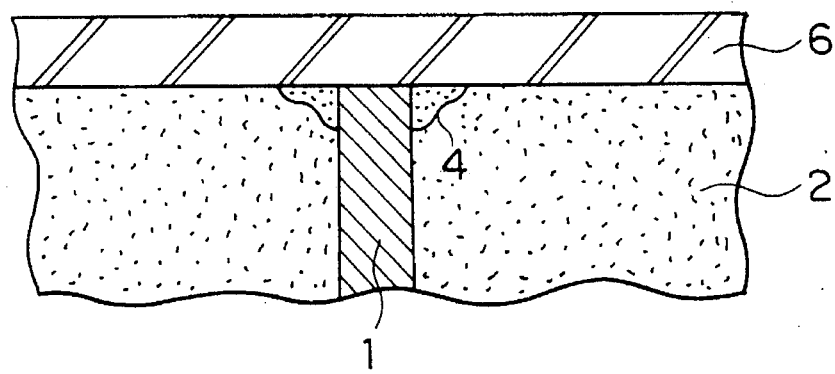
FIG. 3 is a cross-sectional view showing a conventional multilayer interconnection ceramic substrate having a polyimide layer for multilayer interconnection.
Figure 4:
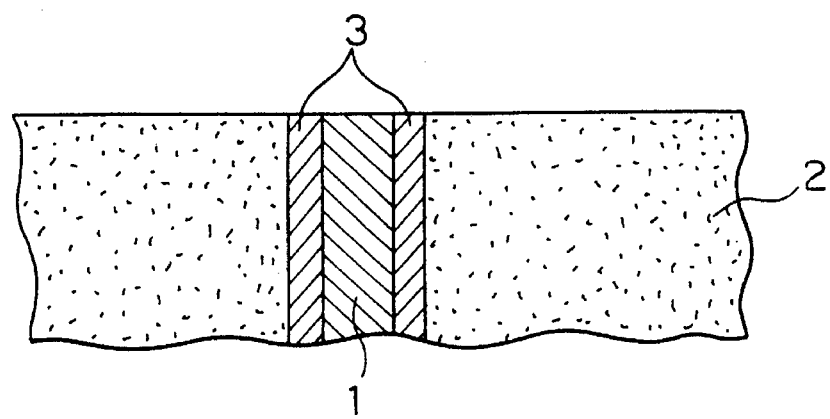
FIG. 4 is a cross-sectional view showing an enforced structure in the vicinity of a via-conductor in a multilayer interconnection ceramic substrate according to an embodiment of the the present invention.

Now, preferred embodiments will be described with reference to the drawings. FIG. 4 is a schematic cross-sectional view showing a via-structure formed in a multilayer interconnection ceramic substrate according to a first embodiment of the present invention. The multilayer interconnection substrate has a ceramic substrate 2, a via-conductor 1 penetrating the ceramic substrate 2 and a resin layer 3 formed at the interface of the via-conductor 1 and the ceramic substrate 2.

Although it is preferable that the gap between the via-conductor and the ceramic is provided by controlling an ambient atmosphere for sintering and by controlling a composition in a paste, the method for providing the gap is not limited to any of those. It is preferable that thermosetting resins to be cured at a temperature between 300° and 500° C., such as polyimide or benzo-cyclo-butene, are employed in the present invention. The compositions of the resins are, however, not limited to any of those, but extended to a wide varieties of materials. Materials for the substrate and for the conductor are not limited, either.

In the present invention, substantially no crack is formed in ceramic substrates because the gap is formed and present during a sintering step at the interface between the via-conductor and the ceramic substrate. After the sintering step, the resin layer is formed in the gap between the via-conductor and the ceramic substrate. Flexibility of the resin layer can prevent a crack in the ceramic substrate, which would generate in the vicinity of the via-conductor during successive steps because of a difference in thermal expansion coefficient. On the other hand, the electric reliability can be improved because the resin layer prevents ingress of moisture and other contaminants. Furthermore, failures such as swelling of the resin can be avoided because no crack is generated in the ceramic substrate and the gap is filled with the resin.

Figure 5:
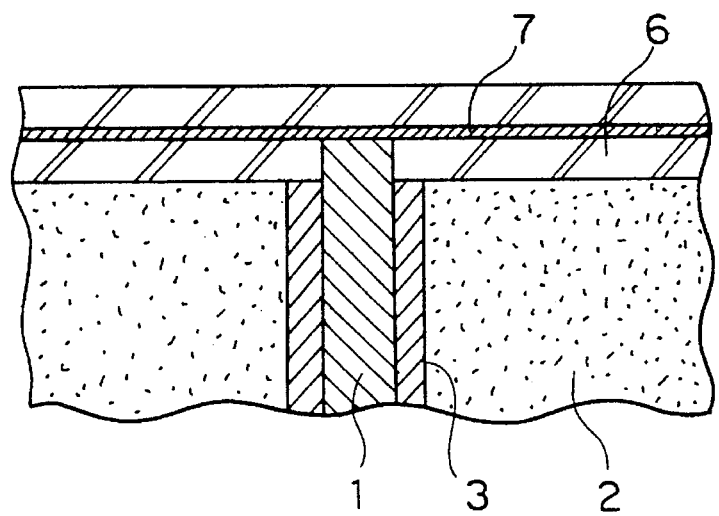
FIGS. 5 and 6 are cross-sectional views each showing an enforced structure in the vicinity of a via-conductor in a multilayer interconnection ceramic substrate according to another embodiment of the the present invention.
Figure 6:
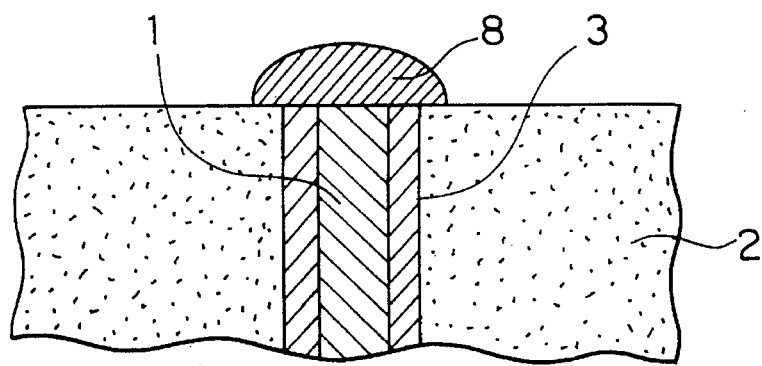

FIGS. 5 and 6 each shows a multilayer interconnection substrate according to another embodiment. The multilayer interconnection substrate of FIG. 5 has a polyimide layer for receiving an interconnection layer 7 and formed on the surface of a ceramic substrate 2. The interconnection layer 7 is connected to the via-conductor 1.

The multilayer interconnection substrate of FIG. 6 has a terminal 8 on the surface of a ceramic substrate 2. The terminal 8 is connected to a via-conductor 1 surrounded by a resin layer 3.

Hereinafter, examples of embodiments will be described as Embodiments 1 to 5 wherein a variety of materials are employed for a substrate, a via-conductor and a resin film and a variety of conditions in ambient atmosphere and temperature for sintering and curing.

EMBODIMENT 1

A multilayer interconnection ceramic substrate having a specific permittivity of 7.1 and including a via-conductor made of Ag and a glass-ceramic substrate composed of borosilicate glass and alumina was formed by sintering in an $N_2$-ambient at 900° C. A gap was generated at an interface between a via-conductor 1 and the substrate 2 without any crack formed in the substrate. The resultant substrate was immersed into a polyimide precursor liquid and an ambient atmosphere was evacuated in vacuo. After removal of the substrate from the polyimide precursor liquid, the substrate was subjected to a curing step performed in a nitrogen gas stream at 450° C.

An SEM (Scanning Electron Microscopic) observation performed on the substrate surface and a cross-sectional surface of the substrate after mechanical polishing of the substrate surface clarified that a resin layer was formed perfectly between the via-conductor and the substrate and from the surfaces to a depth of about 0.5 mm in the gap, as shown in FIG. 4. Furthermore, an ink impregnation test performed on the substrate thus obtained indicated that no impregnation took place at all. Moreover, a PCT (Pressure Cooker Test) applied to the substrate after formation of an interconnection pattern by sputter-deposition on the substrate surface did not detect any irregularity after 1000 hours elapsed. The PCT result was such that, a terminal pattern is further formed on the substrate surface by employing sputtering and plating technologies. Then, a polyimide layer was formed by spin-coating on the substrate and hardened thermally. The process did not involve any irregularity such as swelling, resulting in formation of an excellent resin layer for multilayer interconnection.

EMBODIMENT 2

A multilayer interconnection ceramic substrate similar to Embodiment 1 and having a gap at an interface between a via-conductor 1 and the substrate 2 was formed and immersed in a benzo-cyclo-butene precursor liquid and the ambient atmosphere was evacuated in vacuo. The substrate was subjected to curing in a nitrogen gas stream at 300° C. after removal from the benzo-cyclo-butene precursor liquid.

An SEM observation performed both on the substrate surface and a cross-sectional surface of the substrate after mechanical polishing of the substrate surface clarified that a resin layer was formed perfectly between the via-conductor 1 and the ceramic substrate 2 and from the surface to a depth of about 0.5 mm in the gap, as shown in FIG. 4.

Furthermore, an ink impregnation test performed on the resultant substrate indicated that there was no ink impregnation was observed. Moreover, a PCT applied to the substrate after sputter-deposition of an interconnection pattern on the substrate surface did not detect any irregularity even after 1000 hours. A step for hardening the benzo-cyclobutene precursor layer spin-coated on the substrate after formation of a terminal pattern on the substrate surface by employing sputtering and plating technologies did not induce any irregularity such as swelling, resulting in formation of an excellent resin layer for multilayer interconnection.

EMBODIMENT 3

A multilayer interconnection ceramic substrate having a specific permittivity of 6.0 and including a via-conductor made of Cu and a glass-ceramic substrate composed of borosilicate glass and alumina was formed by sintering in an $N_2$-ambient at 950° C. A gap was formed at an interface between a via-conductor 1 and the substrate 2 without any crack generated in the substrate. An ambient atmosphere was evacuated in vacuo during immersion of the resultant substrate into a polyimide precursor liquid. After removal of the substrate from the polyimide precursor liquid, the substrate was subjected to curing in a nitrogen gas stream at 450° C.

An SEM observation performed on the substrate surface and a cross-sectional surface after mechanical polishing of the substrate surface detected that a resin layer was formed perfectly between the via-conductor 1 and the ceramic substrate 2 and from the surface to a depth of about 0.5 mm in the gap, as shown in FIG. 4. An ink impregnation test performed on the resultant substrate did not detect any impregnation. Moreover, a PCT applied to the substrate after formation of an interconnection pattern on the substrate surface by employing a sputter-deposition technology did not detect any irregularity even after 1000 hours. Furthermore, hardening the polyimide precursor layer coated on the substrate after formation of a terminal pattern on the substrate surface by employing sputtering and plating technologies did not provide any irregularity such as swelling, resulting in formation of an excellent resin layer for multilayer interconnection.

EMBODIMENT 4

A multilayer interconnection ceramic substrate similar to Embodiment 3 and having a gap at an interface between a via-conductor 1 and the substrate 2 was formed and immersed into a benzo-cyclo-butene precursor liquid and the ambient atmosphere was evacuated in vacuo. After removal from the benzo-cyclo-butene precursor liquid, the substrate was subjected to curing in a nitrogen gas stream at 300° C. An SEM observation of the substrate surface and a cross-sectional surface after mechanical polishing of the substrate surface clarified that a resin layer was formed perfectly between the via-conductor 1 and the ceramic substrate 2 and from the surface to a depth of about 0.5 mm in the gap, as shown in FIG. 4.

Furthermore, an ink impregnation test performed on the resultant substrate did not detect any impregnation. A PCT applied to the substrate after formation of an interconnection pattern on the substrate surface by employing a sputter-deposition technology did not exhibit any irregularity even after 1000 hours. Hardening a benzo-cyclo-butene precursor layer spin-coated on the substrate after formation of a terminal pattern on the substrate surface by employing sputtering and plating technologies did not provide any irregularity such as swelling, resulting in formation of an excellent resin layer for multilayer interconnection.

EMBODIMENT 5

A multilayer interconnection ceramic substrate having a specific permittivity of 4.4 and including a via-conductor made of Ag and a glass-ceramic substrate composed of borosilicate glass, quartz glass and cordierite was formed by sintering in an $N_2$-ambient at 900° C. A gap was generated at an interface between a via-conductor 1 and the substrate 2 without any crack generated in the ceramic substrate. The resultant substrate was immersed into a polyimide precursor liquid and the ambient atmosphere was evacuated in vacuo. After removal of the substrate from the polyimide precursor liquid, the substrate was subjected to curing in a nitrogen gas stream at 450° C.

An SEM observation performed on the substrate surface and a cross-sectional surface after mechanical polishing of the substrate surface clarified that a resin layer was formed perfectly between the via-conductor 1 and the ceramic substrate 2 and from the substrate surface to a depth of about 0.5 mm in the gap, as shown in FIG. 4. Moreover, an ink impregnation test performed on the resultant substrate did not detect any impregnation. A PCT applied to the substrate after formation of an interconnection pattern on the substrate surface by employing a sputter-deposition technology did not exhibit any irregularity even when 1000 hours elapsed. A benzo-cyclo-butene precursor layer was spin-coated on the substrate and hardened after formation of a terminal pattern on the substrate surface by employing sputtering and plating technologies did not provide any irregularity such as swelling, resulting in formation of an excellent resin layer for multilayer interconnection.

EMBODIMENT 6

A multilayer interconnection ceramic substrate similar to Embodiment 5 and having a gap at an interface between a via-conductor 1 and the substrate 2 was formed and immersed into a benzo-cyclo-butene precursor liquid and an ambient atmosphere was evacuated in vacuo. The substrate was subjected to curing in a nitrogen gas stream at 300° C. after removal from the benzo-cyclo-butene precursor liquid. An SEM observation performed on the substrate surface and a cross-sectional surface after mechanical polishing of the substrate surface clarified that a resin layer was formed perfectly between the via-conductor 1 and the ceramic substrate 2 and from the surface to a depth of about 0.5 mm in the gap, as shown in FIG. 4.

Moreover, an ink impregnation test performed on the resultant substrate surface did not detect any impregnation. A PCT applied to the substrate after formation of an interconnection pattern on the substrate surface by employing a sputter-deposition technology did not exhibit any irregularity after 1000 hours. Hardening a benzo-cyclo-butene layer spin-coated on the substrate after formation of a terminal pattern on the substrate surface by employing sputtering and plating technologies did not provide any irregularity such as swelling, resulting in formation of an excellent resin layer for multilayer interconnection.

COMPARATIVE EXAMPLE 1

A multilayer interconnection ceramic substrate having a specific permittivity of 7.1 and including a via-conductor made of Ag and a glass-ceramic substrate composed of borosilicate glass and alumina was formed by sintering in an open-air at 900° C. It was observed that cracks had generated in a portion of the substrate adjacent to a via-conductor. A step for hardening a polyimide layer spin-coated on the substrate thus formed after formation of a terminal pattern on the substrate surface by employing sputtering and plating technologies induced an irregularity of swelling. Furthermore, I/O pins, which were welded onto the resultant substrate by employing an Au-Sn solder, fractured the substrate when a lateral strain was applied to the I/O pins.

COMPARATIVE EXAMPLE 2

A multilayer interconnection ceramic substrate having a specific permittivity of 7.1 and including a via-conductor made of silver and a glass-ceramic substrate composed of boro-silicate glass and alumina was formed by sintering in an $N_2$-ambient at 900° C. It was observed that a gap had generated at an interface between a via-conductor 1 and the substrate 2. A PCT applied to the resultant substrate after formation of an interconnection pattern by employing a sputter-deposition technology indicated a corrosion-induced rise in resistance of the conductor after only 100 hours elapsed. Hardening a polyimide layer spin-coated on the substrate after formation of a terminal pattern on the substrate surface by employing sputtering and plating technologies generated an irregularity of swelling.

COMPARATIVE EXAMPLE 3

A pattern was formed by employing sputtering and plating technologies on a surface of a multilayer interconnection ceramic substrate having cracks similar to Comparative Example 1. A step for hardening a benzo-cyclo-butene layer spin-coated on the resultant substrate induced an irregularity of swelling. I/O pins welded to this substrate by employing an Au-Sn solder fractured the substrate when a lateral strain was applied to the I/O pins.

COMPARATIVE EXAMPLE 4

A pattern was formed by employing sputtering and plating technologies on a multilayer interconnection ceramic substrate having a gap at an interface between a via-conductor and the substrate similarly to Comparative Example 2. A step for hardening a benzo-cyclo-butene layer coated on the resultant substrate induced an irregularity of swelling.

As described above, the present invention can provide a multilayer interconnection ceramic substrate having a high reliability and a high strength, which can be produced at a low cost.

A structure enforced in the vicinity of a via-conductor in a multilayer interconnection ceramic substrate, such as an insulating substrate, a multi-chip module substrate and a semiconductor package, according to the present invention is useful as a bonded structure in a semiconductor device for mounting LSI chips and packagings, which has an extremely high industrial value.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A multilayer interconnection substrate comprising:

a ceramic substrate, a via-conductor formed by sintering and penetrating said ceramic substrate, and a resin layer formed at an interface between said via-conductor and said ceramic substrate and at least in a vicinity of a surface of said ceramic substrate.

2. A multilayer interconnection substrate as defined in claim 1 further comprising a polyimide layer, formed on said ceramic substrate, for receiving an interconnection layer connected to said via-conductor.

3. A multilayer interconnection substrate as defined in claim 1 further comprising a terminal overlying said ceramic substrate and connected to said via-conductor.

4. A multilayer interconnection substrate as defined in claim 1 wherein said resin layer is made of a resin selected from a group consisting of polyimide and benzo-cyclobutene.

5. A multilayer interconnection substrate as defined in claim 1 wherein said resin layer is made of a thermo-setting resin.

6. A multilayer inter, connection substrate as defined in claim 1 wherein said via-conductor is made of one of metals and alloys selected from a group consisting of W, Mo, Au, Ag, Cu and Ag-Pd.

7. A multilayer interconnection substrate as defined in claim 1, wherein said via-conductor is formed as a solid plug.

8. A multilayer interconnection substrate as defined in claim 6, wherein said via-conductor is formed from a paste including said one of metals and alloys.

9. A multilayer interconnection structure, comprising:

a substrate, a via-conductor formed by sintering and penetrating said substrate, said via-conductor being formed as a solid plug, and a resin layer formed at an interface between said via-conductor and said substrate and at least in a vicinity of a surface of said substrate.

10. A multilayer interconnection structure as defined in claim 9, further comprising a polyimide layer, formed on said substrate, for receiving an interconnection layer connected to said via-conductor.

11. A multilayer interconnection structure as defined in claim 9, further comprising a terminal overlying said substrate and connected to said via-conductor.

12. A multilayer interconnection structure as defined in claim 9, wherein said resin layer is made of a resin selected from a group consisting of polyimide and benzo-cyclobutene.

13. A multilayer interconnection structure as defined in claim 9, wherein said resin layer is made of a thermo-setting resin.

14. A multilayer interconnection structure as defined in claim 9, wherein said via-conductor is made of one of metals and alloys selected from a group consisting of W, Mo, Au, Ag, Cu and Ag-Pd.

15. A multilayer interconnection structure as defined in claim 13, wherein said via-conductor is formed from a paste including said one of metals and alloys.

16. A multilayer interconnection structure as defined in claim 10, wherein said resin layer is made of a resin selected from a group consisting of polyimide and benzo-cyclobutene.

17. A multilayer interconnection structure as defined in claim 10, wherein said resin layer is made of a thermo-setting resin.

18. A multilayer interconnection structure as defined in claim 10, wherein said via-conductor is made of one of metals and alloys selected from a group consisting of W, Mo, Au, Ag, Cu and Ag-Pd.

19. A multilayer interconnection structure as defined in claim 18, wherein said via-conductor is formed from a paste including said one of metals and alloys.

20. A multilayer interconnection structure as defined in claim 9, wherein said resin layer is for reducing stress at said interface between said substrate and said via-conductor during sintering.

* * * * *